US008436514B2

(12) United States Patent
Fukano et al.

(10) Patent No.: US 8,436,514 B2
(45) Date of Patent: May 7, 2013

(54) ACOUSTIC WAVE DEVICE COMPRISING AN INTER-DIGITAL TRANSDUCER ELECTRODE

(75) Inventors: Toru Fukano, Kyoto (JP); Yoshihiro Ookubo, Kyoto (JP); Junya Nishii, Kyoto (JP)

(73) Assignee: Kyocera Corporation, Kyoto (JP)

( * ) Notice: Subject to any disclaimer, the term of this patent is extended or adjusted under 35 U.S.C. 154(b) by 454 days.

(21) Appl. No.: 12/678,989

(22) PCT Filed: Oct. 30, 2008

(86) PCT No.: PCT/JP2008/069767
§ 371 (c)(1),
(2), (4) Date: May 20, 2010

(87) PCT Pub. No.: WO2009/057699
PCT Pub. Date: May 7, 2009

(65) Prior Publication Data
US 2010/0225202 A1    Sep. 9, 2010

(30) Foreign Application Priority Data

Oct. 30, 2007  (JP) .................................. 2007-281464
Jul. 30, 2008  (JP) .................................. 2008-195811

(51) Int. Cl.
*H01L 41/08*    (2006.01)
(52) U.S. Cl.
USPC ....................................... 310/344; 310/313 R
(58) Field of Classification Search ................... 310/344
See application file for complete search history.

(56) References Cited

U.S. PATENT DOCUMENTS

| 7,259,500 | B2 | 8/2007 | Iwamoto et al. | |
|---|---|---|---|---|
| 7,427,824 | B2* | 9/2008 | Iwamoto et al. | 310/344 |
| 7,583,161 | B2 | 9/2009 | Tanaka | 333/133 |
| 7,944,125 | B2* | 5/2011 | Takada et al. | 310/348 |
| 2007/0018539 | A1 | 1/2007 | Nagashima | 310/348 |
| 2010/0244625 | A1* | 9/2010 | Fukano et al. | 310/313 B |
| 2012/0032759 | A1* | 2/2012 | Nishii et al. | 333/193 |
| 2012/0182091 | A1* | 7/2012 | Ookubo | 333/193 |

FOREIGN PATENT DOCUMENTS

| JP | 61-096579 | 6/1986 |
|---|---|---|
| JP | 08213874 A | 8/1996 |
| JP | 09-064579 | 3/1997 |
| JP | 09-246905 | 9/1997 |
| JP | 2000-261284 | 9/2000 |

(Continued)

OTHER PUBLICATIONS

Japanese language office action dated May 15, 2012 and its English language translation issued in corresponding Japanese application 2009539107.

*Primary Examiner* — Jaydi San Martin
(74) *Attorney, Agent, or Firm* — DLA Piper LLP (US)

(57) ABSTRACT

Provided is a highly reliable acoustic wave device wherein deterioration of electrical characteristics due to deformation of a protective cover is suppressed. A method for manufacturing such acoustic wave device is also provided. The acoustic wave device has a piezoelectric substrate 1 propagating an acoustic wave; an excitation electrode arranged on a first main surface of the piezoelectric substrate 1; a columnar outside connection-use electrode 10 electrically connected to the excitation electrode; a protective cover 17 having a hollow accommodating space 8 in which the excitation electrode is accommodated on the first main surface; and a conductive layer 18 connected to the electrode 10 on the protective cover 17.

15 Claims, 6 Drawing Sheets

FOREIGN PATENT DOCUMENTS

| | | |
|---|---|---|
| JP | 2003-037471 | 2/2003 |
| JP | 2007-266865 | 10/2007 |
| WO | WO 2004/107572 A1 | 12/2004 |
| WO | WO 2007/083432 A1 | 7/2007 |

* cited by examiner

STEP a

STEP b

STEP c

ACOUSTIC WAVE DEVICE COMPRISING AN INTER-DIGITAL TRANSDUCER ELECTRODE

CROSS-REFERENCE TO THE RELATED APPLICATIONS

This application is a national stage of international application No. PCT/JP2008/069767 filed on Oct. 30, 2008 and claims the benefit of priority under 35 USC 119 to Japanese Patent Application No. 2007-281464 filed on Oct. 30, 2007 and Japanese Patent Application No. 2008-195811 filed on Jul. 30, 2008, the entire contents of which are incorporated herein by reference.

TECHNICAL FIELD

The present invention relates to an acoustic wave device mainly used in a wireless communication circuit of a mobile communication device etc.

BACKGROUND ART

In recent years, portable terminals used for mobile communication have been increasingly reduced in size and lightened in weight. Along with this, the portable terminals are being made multi-banded to be able to handle a plurality of communication systems and are being given more functions and higher functions. Therefore, the built-in circuits have increased. For this reason, the electronic parts used are, for improvement of their mounting density, being strongly demanded to be surface mountable small-size parts.

One of the key parts of a portable terminal is an acoustic wave device. As the acoustic wave device, there are a surface acoustic wave device having an excitation electrode formed on a piezoelectric substrate or a piezoelectric thin film resonator sandwiching a thin piezoelectric film by metallic electrodes.

A surface acoustic wave device has to be provided with a hollow portion to secure a vibration space in a portion where an acoustic wave vibrates, and this vibration space has to be sealed air-tight. In such surface acoustic wave devices as well, together with low loss and an out-of-band cutoff characteristic, their being surface mountable small-sized surface acoustic wave devices is also being demanded.

In response to demands for smaller size, a surface acoustic wave device shown in FIG. 4 is proposed. In the surface acoustic wave device shown in FIG. 4, a vibration space of the surface acoustic wave is secured by forming a protective cover 46 so as to surround an IDT (inter digital transducer) formed on a piezoelectric substrate and exciting the surface acoustic wave (see, for example, Patent Document 1).

In this regard, cases employing, as electronic parts to be mounted in a portable terminal, electronic parts configured by a plurality of elements such as a surface acoustic wave device and IC or the like mounted on the same substrate, that is, formed into modules, are increasing. This is because by forming such modules, the circuit design efficiency can be improved. In addition, the mount circuit design is facilitated, the number of development steps is decreased, and the design period can be shortened. In electronic parts formed into modules, in order to protect the elements mounted on the same substrate, the elements are usually sealed by a resin by transfer molding. Note that, as electronic parts formed into modules which are mounted in a portable terminal, there are, for example, a GPS (Global Positioning System) module and a front end module processing transmitted and received signals.

In this regard, when resin-sealing the elements mounted on the substrate by transfer molding, a high pressure is applied to the elements under a high temperature atmosphere. In the conventional surface acoustic wave device shown in FIG. 4, a protective cover 46 was sometimes greatly deformed due to the high pressure at the time of the transfer molding. When the protective cover 46 was greatly deformed, contact of the protective cover 46 with the IDT electrodes, large distortion of the vibration space, or the like occurred thereby causing the problem of a large deterioration of electrical characteristics of the surface acoustic wave device.

Patent Document 1: Japanese Patent Publication (A) No. 9-246905

DISCLOSURE OF THE INVENTION

The present invention was devised in order to solve the problem explained above and provides an acoustic wave device capable of suppressing deterioration of electrical characteristics due to deformation of a protective cover and excellent in reliability.

An acoustic wave device according to an embodiment of the present invention has a substrate propagating an acoustic wave, an excitation electrode formed on a first main surface of the substrate, and an columnar outside connection-use electrode electrically connected to the excitation electrode. Further, the device has a protective cover covering a region of formation of the excitation electrode in a state spaced from the top of the first main surface and thereby forming a hollow accommodating space together with the first main surface, and a conductive layer connected to the outside connection-use electrode on the protective cover.

According to the acoustic wave device described above, the conductive layer on the protective cover is formed continuously with the outside connection-use electrode, therefore the conductive layer is supported using the outside connection-use electrode as a support column, deformation of the protective cover forming the hollow structure can be suppressed, an acoustic wave device in which hardly any deterioration of electrical characteristics due to the deformation of the vibration space occurs and which is excellent in long term reliability can be realized.

Further, by providing the protective cover on the piezoelectric substrate, a ceramic package for accommodating the acoustic wave device becomes unnecessary, and a WLP (wafer level package) type small-sized acoustic wave device capable of integrally forming an acoustic wave device at a wafer level enabling a surface mount structure can be provided.

Further, by the conductive layer performing the role of an electromagnetic shield, an acoustic wave device resisting to the effects of external electromagnetic waves and suffering from little change in electrical characteristics can be provided. Further, there is also the advantage that the conductive layer on the protective cover enables the acoustic wave device to be improved in moisture resistance.

EXPLANATION OF REFERENCE

Figure 1A:
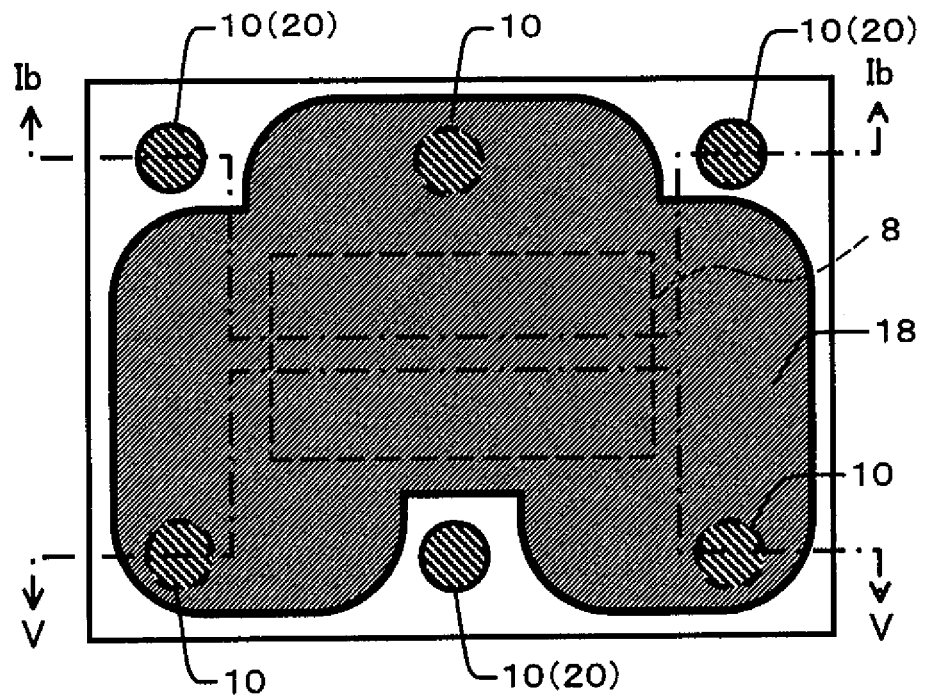
FIG. 1 A is a plan view showing an embodiment of a surface acoustic wave device according to the present invention, and B is a cross-sectional view taken along an Ib-Ib line of A.

1: piezoelectric substrate
2: IDT electrode
3: connecting line
5: protective film
6: frame member
7: lid member
8: hollow accommodating space
10: outside connection-use electrode
11: insulation layer
12: protective layer
17: protective cover
18: conductive layer

BEST MODE FOR CARRYING OUT THE INVENTION

Below, an embodiment of an acoustic wave device of the present invention is explained in detail by using the drawings. Note that, the acoustic wave device of the present invention is explained focusing on a surface acoustic wave device having an IDT electrode provided with at least one comb-shaped electrode configured by a plurality of electrode fingers.

Figure 1B:
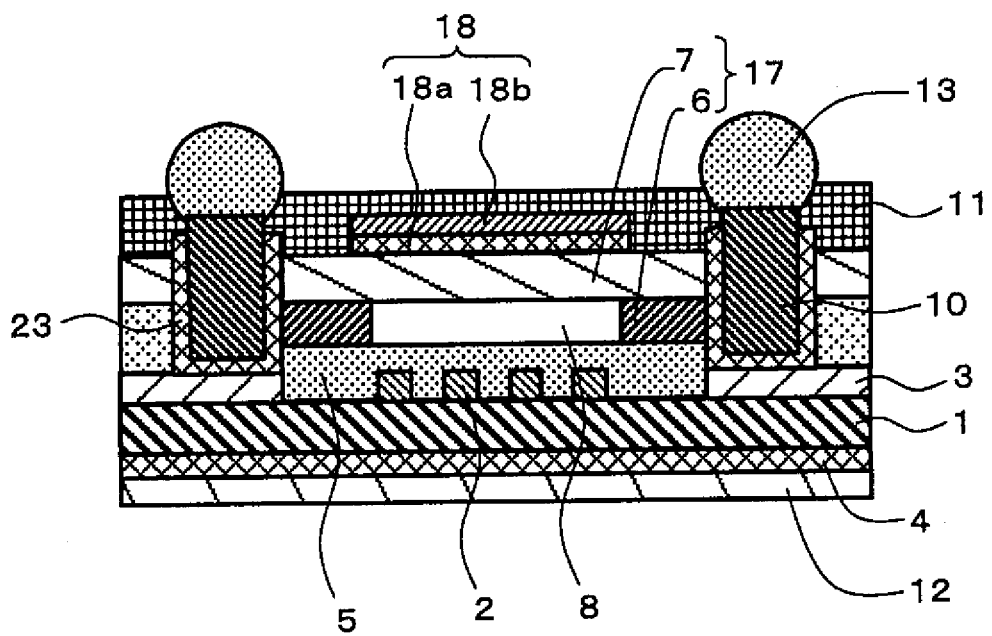
Figure 5:
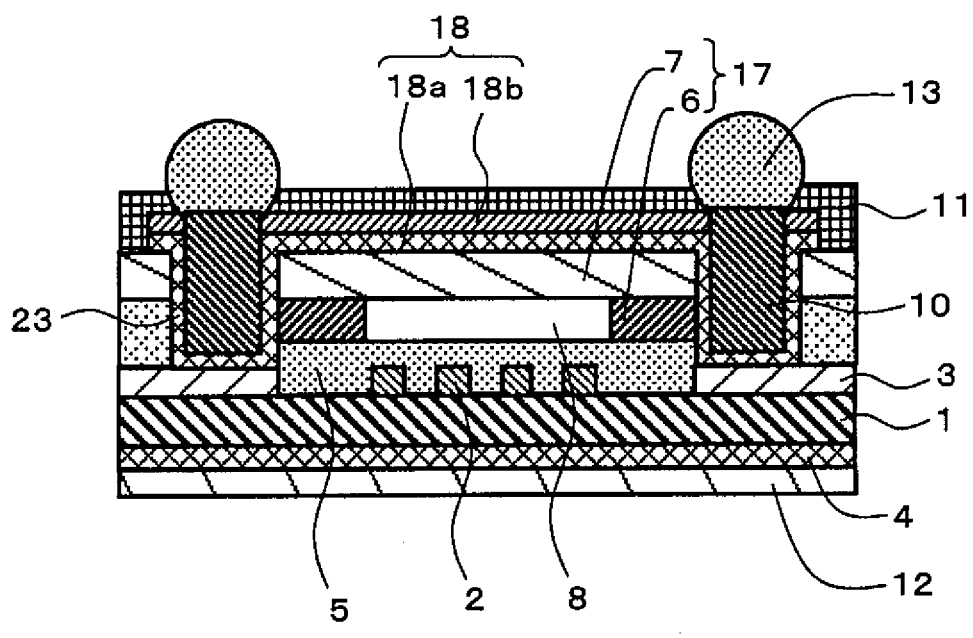
FIG. 5 A cross-sectional view taken along a V-V line in FIG. 1.

The surface acoustic wave device of the present embodiment is, as shown in FIG. 1A, FIG. 1B, and FIG. 5, mainly configured by a piezoelectric substrate 1 for propagating a surface acoustic wave, an IDT electrode 2 as an excitation electrode formed on a first main surface of the piezoelectric substrate 1, connecting lines 3 formed on the first main surface for electrically connecting the IDT electrode 2 and external circuits, columnar outside connection-use electrodes 10 which are formed above the ends of the connecting lines 3, a protective cover 17 having a hollow accommodating space 8 for accommodating the IDT electrode 2 and arranged on the first main surface, and a conductive layer 18 which is formed on the protective cover 17 and is connected to the outside connection-use electrodes 10.

Figure 6:
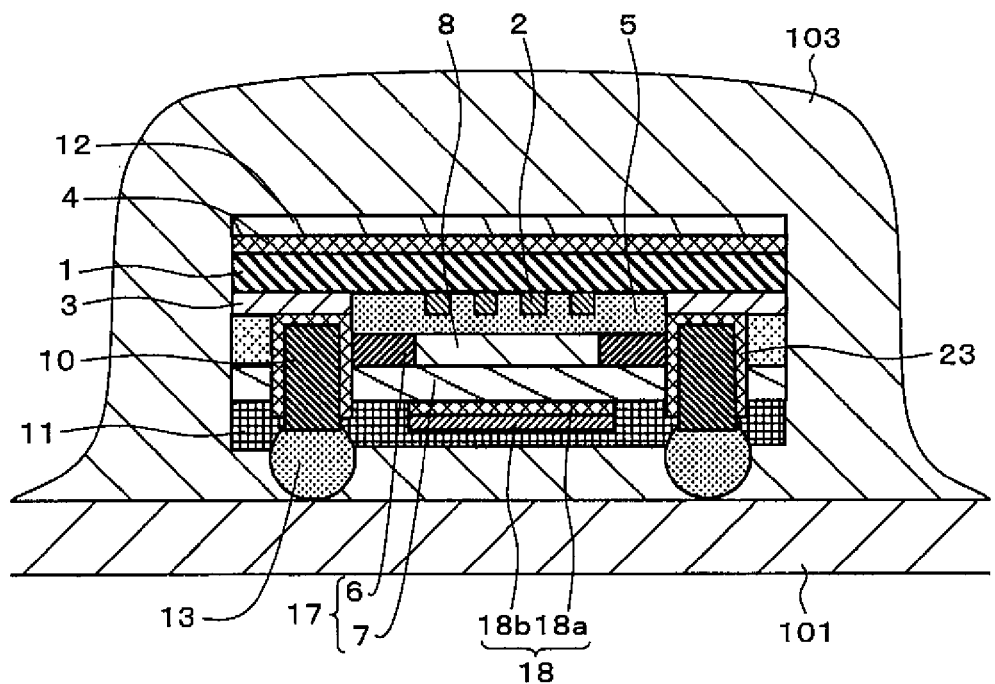
FIG. 6 A cross-sectional view showing an example of a state where the surface acoustic wave device shown in FIG. 1 is mounted on a circuit substrate.

FIG. 6 is a cross-sectional view showing an example of a state where the surface acoustic wave device of the present embodiment is mounted on a circuit substrate 101.

The surface acoustic wave device is mounted on the circuit substrate 101 by sealing by a resin 103 in a state where outside connection terminals 13 formed on the outside connection-use electrodes 10 are made to abut against the circuit substrate 101. The resin sealing is carried out by, for example, transfer molding. A high pressure is applied to the surface acoustic wave device under a high temperature atmosphere.

In the surface acoustic wave device of the present embodiment, as shown in FIG. 1A and FIG. 5, the conductive layer 18 formed on the protective cover is formed continuously with the outside connection-use electrodes 10 and is connected to the outside connection-use electrodes 10, therefore a state where the conductive layer 18 is supported using the outside connection-use electrodes 10 as support columns is exhibited. For example, even in a case where high pressure is applied to the surface acoustic wave device by transfer molding, deformation of the protective cover 17 forming the hollow structure can be suppressed. Accordingly, an acoustic wave device which is resistant to deformation of the vibration space and is stable in electrical characteristics can be realized.

Preferably a plurality of outside connection-use electrodes 10 are provided. In the present embodiment, three outside connection-use electrodes 10 are provided. By providing the plurality of outside connection-use electrodes 10 in this way, portions where the conductive layer 18 is supported increase, therefore the effect of suppression of deformation of the protective cover 17 can be raised. Further, in order to more reliably support the conductive layer 18 by the outside connection-use electrodes 10, preferably the accommodating space 8 is located between two outside connection-use electrodes 10 when seen from a plan view. Note that, the positioning of the accommodating space 8 between two outside connection-use electrodes 10 means a positional relationship where a straight line connecting centers of two outside connection-use electrodes 10 when seen from a plan view crosses the accommodating space 8. A more preferred positional relationship between the outside connection-use electrodes 10 and the accommodating space is one where a straight line connecting centers of two outside connection-use electrodes 10 when seen from a plan view passes through the center of the accommodating space 8. In the surface acoustic wave device of the present embodiment, as shown in FIG. 1A, the accommodating space 8 is located between the outside connection-use electrode 10 located on the left bottom and the outside connection-use electrode 10 located at the top center and between the outside connection-use electrode 10 located on the right bottom and the outside connection-use electrode 10 located at the top center.

Further, in order to more strongly connect the outside connection-use electrodes 10 and the conductive layer 18, preferably the conductive layer 18 is connected over the entire outer peripheral surfaces of the upper portions of the outside connection-use electrodes 10. In particular, when producing the conductive layer 18 and the outside connection-use electrodes 10 by the same material by the same process, such a connection state is preferred. Alternatively, the conductive layer 18 may be connected to the outside connection-use electrodes 10 so as to cover the entire top surfaces of the outside connection-use electrodes 10 or may be connected to both of the outer peripheral surfaces and the top surfaces of the outside connection-use electrodes 10.

Further, by providing the protective cover 17 on the piezoelectric substrate 1, a ceramic package for accommodating the surface acoustic wave device becomes unnecessary, and a WLP type small-sized surface acoustic wave device capable of integrally forming a surface acoustic wave device at the wafer level enabling a surface mount structure can be obtained.

Further, the conductive layer 18 performs the role of an electromagnetic shield, therefore the surface acoustic wave device becomes resistant to the effects of external electromagnetic waves, so a surface acoustic wave device having stable electrical characteristics can be obtained. In order to make the surface acoustic wave device more resistant to the effects of external electromagnetic waves, preferably the conductive layer 18 is arranged in a region right above the IDT electrode 2. Further, there is also the advantage that the conductive layer 18 on the protective cover 17 enables the surface acoustic wave device to be improved in moisture resistance.

The conductive layer 18 can be formed by various types of metal materials. Among those, Cu or Ni is preferably used for forming it. By having the conductive layer 18 contain Cu or Ni, the stability of the reference potential is improved when the conductive layer 18 is used as a ground potential conductor or other reference potential use conductor.

Further, the thickness of the conductive layer 18 is preferably about 1 to 50 μm. By setting the thickness of the conductive layer 18 to 1 to 50 μm, a surface acoustic wave device which can increase the effect of prevention of deformation of the protective cover 17 at the time of the transfer molding and enables reduction of the height can be realized. A more preferred range of thickness of the conductive layer 18 is 10 to 25 μm. By setting the thickness of the conductive layer 18 within this range, a surface acoustic wave device that enables reduction of the height can be realized while sufficiently maintaining the effect of prevention of deformation of the protective cover 17 at the time of transfer molding.

The conductive layer 18 in the present embodiment is configured by a first conductive layer 18a arranged on the top surface of the protective cover 17 and a second conductive layer 18b arranged on the top surface of the first conductive layer 18a. A Young's modulus of the first conductive layer 18a is larger than the Young's modulus of the protective cover 17. For example, the Young's modulus of the protective cover 17 is 0.5 to 1.0 GPa, while the Young's modulus of the first conductive layer 18a is 100 to 250 GPa. Thus, the protective cover 17 becomes more resistant to deformation. As the material of the first conductive layer 18a, a metal having good adhesivity with the protective cover 17 such as, Ni, Cr, or Ti is preferred. By forming the second conductive layer 18b having a thickness of about 15 to 50 μm on the first conductive layer 18a made of such a material, a state where the second conductive layer 18b is strongly bonded onto the protective cover 17 is exhibited, and the effect of prevention of deformation of the protective cover 17 can be raised. The second conductive layer 18b is comprised of for example Cu. Note that, the conductive layer 18 may have a structure configured by one layer or may have a multi-layer structure configured by three or more layers as well. In the case where the multi-layer structure is employed, the conductive layer 18 may be formed so that the hardness becomes lower in order from the protective cover 17 side.

Further, the surface of the conductive layer 18 may be roughened so as to form relief structures. In this case, when providing the insulation layer 11 covering the conductive layer 18, the adhesivity of the conductive layer 18 and the insulation layer 11 is improved, and the heat conductivity from the conductive layer 18 to the insulation layer 11 rises. A preferred arithmetic mean roughness of the surface of the conductive layer 18 is about 1 to 3 μm.

The conductive layer 18 is preferably provided so as to cover the entire accommodating space when seen from a plan view. In other words, the accommodating space is located inside the conductive layer 18 when seen from a plan view. In FIG. 1A, the accommodating space 8 is indicated by a dotted line so that the positional relationship between the accommodating space 8 and the conductive layer 18 can be grasped. By forming the conductive layer 18 in this way, occurrence of deformation in the accommodating space 8 can be more reliably suppressed. Further, more preferably the area of the conductive layer 18 is not less than 50% of the area of the top surface of the protective cover 17. Thus, the strength of the protective cover 17 rises, and deformation of the protective cover 17 at the time of the transfer molding becomes harder to occur. Further, when the conductive layer 18 acts also as a ground electrode, its ground potential is stabilized and the electrical characteristics of the surface acoustic wave device are stabilized. Note that, more preferably the area of the conductive layer 18 is not less than 70% of the area of the top surface of the protective cover 17.

Further, in the surface acoustic wave of the present embodiment, the conductive layer 18 is formed continuously to the outside connection-use electrode 10 which is electrically connected to the reference potential terminals among the outside connection-use electrodes 10.

By connection of the conductive layer 18 to the outside connection-use electrodes 10 which are electrically connected to the reference potential terminals in this way, an inductance component of the conductive layer 18 can be added to the outside connection-use electrodes 10, and the amount of out-of-band attenuation of the surface acoustic wave device can be improved. Note that, a "reference potential terminal" means a terminal made conductive with the ground, but is not necessarily zero volt.

On the other hand, as shown in FIG. 1A, on the main surface of the piezoelectric substrate 1, columnar input/output use electrodes 20 formed with a predetermined space from the conductive layer 18 so as not to be connected to the conductive layer 18 are provided as well. Note that, the input/output use electrodes 20 may be grasped as one type of the outside connection-use electrodes 10. In the present application, the explanation is, sometimes given without differentiating between the input/output electrodes 20 and the outside connection-use electrodes 10. The input/output use electrodes 20 are for inputting electric signals to the IDT electrode 2 from the outside or for outputting electrical signals of the IDT electrode 2 to the outside and are electrically connected to the IDT electrode 2.

Further, the conductive layer 18 is preferably formed by the same material as the outside connection-use electrodes 10. Accordingly, the connection strength of the conductive layer 18 with the outside connection-use electrodes 10 is improved and the effect of prevention of deformation of the accommodating space 8 can be raised. Further, the conductive layer 18 and the outside connection-use electrodes 10 can be integrally formed, the production process of the surface acoustic wave device is simplified, and the productivity can be improved.

Further, the connecting lines 3 are preferably electrically connected to the conductive layer 18 through the outside connection-use electrodes 10.

Accordingly, the parasitic capacitance generated between connecting lines 3 on the surface of the piezoelectric substrate 1 can be reduced, therefore a surface acoustic wave device with small insertion loss and excellent electrical characteristics can be obtained.

When providing a patterned conductive layer 18, as shown in FIG. 1A, preferably the pattern has a center portion with a large area so that the strength can be held and the reference potential can be stabilized. Further, the pattern preferably has small area projecting portions which project from the center portion so that inductance components can be added. In FIG. 1A, in the small area projecting portions of the conductive layer 18, the conductive layer 18 continues with and is connected to the outside connection-use electrodes 10.

Further, as shown in FIG. 1, in the surface acoustic wave device of the present embodiment, the protective cover 17 is formed by joining a frame member 6 and a film-shaped lid member 7 placed on the frame member 6. The protective cover 17 is configured by the frame member 6 surrounding the IDT electrode 2 and the film-shaped lid member 7 arranged on the frame member 6, therefore the film-shaped lid member 7 can be produced by a simple process by photolithography, and the vibration space of the IDT electrode 2 can be easily secured.

As the material of the frame member 6 and the lid member 7 configuring the protective cover 17, preferably use is made of a resin which is cured by radical polymerization of the acryl groups, methacryl groups, etc., more specifically a urethane acrylate-based, polyester acrylate-based, or epoxy acrylate-based resin. The resin cured by radical polymerization, in the state after photocuring, has almost no acid or base inflicting damage on the IDT electrode 2 and connecting lines 3 in it. For this reason, a surface acoustic wave device in which damage to the IDT electrode 2 and the connecting lines 3 are reduced and which is excellent in electrical characteristics can be achieved.

Further, in the surface acoustic wave device of the present embodiment, the protective cover 17 and the outside connection-use electrodes 10 are covered by the insulation layer 11. Accordingly, surface mounting by the columnar outside connection-use electrodes 10 becomes possible, and handling becomes easy. The insulation layer 11 contributes to the suppression of conduction between the conductive layer 18 and the outside connection-use electrodes 10 not connected to the reference potential terminals as well. Note that, the insulation layer 11 is formed by an insulation material which can be patterned by photolithography, for example, solder resist.

Further, in the surface acoustic wave device of the present embodiment shown in FIG. 1, the conductive layer 18 is provided on only the top surface of the protective cover 17, but the conductive layer may be formed on the side surfaces of the protective cover 17 and the side surfaces of the insulation layer 11 as well.

Figure 7:
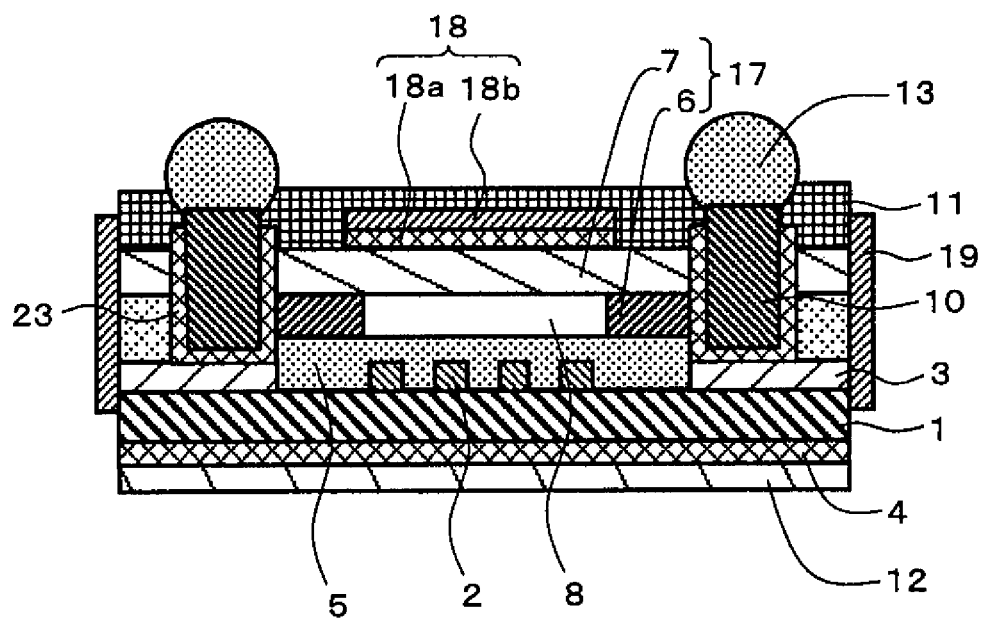
FIG. 7 A cross-sectional view showing a modification of the surface acoustic wave device according to the present invention.

FIG. 7 is a cross-sectional view corresponding to FIG. 1B and shows a surface acoustic wave device of a modification in which the conductive layer 19 is formed on the side surfaces of a sealing member configured by the protective cover 17 and the insulation layer 11.

When the conductive layer 19 is formed also on the side surfaces of the sealing member configured by the protective cover 17 and the outside connection-use electrodes 10 of the surface acoustic wave device in this way, there is almost no influence from outside electromagnetic waves, so the electrical characteristics of the surface acoustic wave device are stabilized. Also, the moisture resistance can be improved.

The thickness, area, and pattern of the conductive layer 19 on the side surfaces may be appropriately set. From the viewpoint of the effect of shutting out the influence of outside electromagnetic waves, as shown in FIG. 7, the conductive layer 19 is preferably provided over a range from the piezoelectric substrate 1 to the conductive layer 18 (insulation layer 11). Note that, the conductive layer 19 on the side surfaces may be provided further over a later-explained back surface electrode 4 as well. Further, the conductive layer 19 is preferably provided so as to surround the four sides of the sealing member. The conductive layer 19 on the side surfaces is connected to the reference potential terminals by extension of portions of the conductive layer 18 up to the side surfaces of the sealing member or the like.

Next, an embodiment of a method of production of a surface acoustic wave device according to the present invention is explained in detail based on the drawings.

FIG. 2 and FIG. 3 are cross-sectional views of steps showing the method of production of a surface acoustic wave device of the present embodiment.

The method of production of a surface acoustic wave device of the present embodiment is provided with a step a of forming an IDT electrode 2 as an excitation electrode of a surface acoustic wave and connecting lines 3 connected to the IDT electrode 2 on a first main surface of a piezoelectric substrate 1, a step b of providing a protective cover 17 so as to cover a region of formation of the IDT electrode 2 on the first main surface and thereby form a hollow accommodating space 8 by the first main surface and the protective cover 17, and a step c of forming columnar outside connection-use electrodes 10 on ends of the connecting lines 3 and forming a conductive layer 18 continuously connected with the outside connection-use electrodes 10 on the protective cover 17.

The method of production of the surface acoustic wave device of the present embodiment is explained below for each step.

(Step a)

Figure 2A:
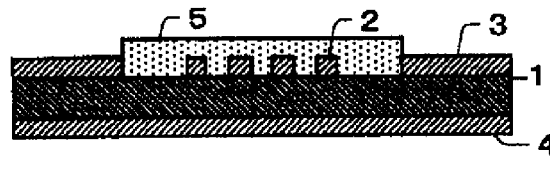
FIG. 2 A to E are cross-sectional views of different steps showing an embodiment of a method of production of a surface acoustic wave device according to the present invention.

As shown in FIG. 2A, first, on the first main surface of a predetermined piezoelectric substrate 1, an IDT electrode 2 provided with at least one comb-shaped electrode comprised of a plurality of electrode fingers having a longitudinal direction in a direction perpendicular to the direction of propagation of the surface acoustic wave in the piezoelectric substrate 1 and a connecting lines 3 which are connected to the IDT electrode 2 for electrically connecting the IDT electrode 2 and external circuits are formed.

Specifically, on the first main surface of a piezoelectric substrate 1 comprised of, for example, a lithium tantalate single crystal, a lithium niobate single crystal, or other single crystal having a piezoelectric property, the excitation electrode for generating the surface acoustic wave, that is, the IDT electrode 2, and connecting lines 3 connected to the IDT electrode 2 are formed. The IDT electrode 2 and the connecting lines 3 are comprised of, for example, an Al—Cu alloy or other Al alloy. The IDT electrode 2 and the connecting lines 3 are formed by sputtering, vapor deposition, CVD (chemical vapor deposition), or other thin film formation method and patterned by photolithography or the like using a reduced projection exposure apparatus (stepper) and RIE (reactive ion etching) apparatus to obtain the desired shapes.

The IDT electrode 2 is shaped as at least a pair of comb-shaped electrodes formed so as to mesh with each other. Further, the IDT electrode 2 may be configured by connecting a plurality of VDT electrodes 2 by a serial connection, a parallel connection, or other method in order to obtain the desired characteristics as well. By connecting a plurality of IDT electrodes 2 in this way, for example, a ladder type surface acoustic wave filter, a double mode surface acoustic wave resonator filter, etc. are configured. Further, in order to close the surface acoustic wave, reflector electrodes may be provided at both ends of the direction of propagation of the surface acoustic wave of the IDT electrode 2 as well. The reflector electrodes can be formed by the same material and same process as the IDT electrode 2.

In this way, the region in which the IDT electrode 2 and the connecting lines 3 are formed on the piezoelectric substrate 1 is referred to as "the surface acoustic wave element region".

Further, a back surface electrode 4 is formed on a second main surface (back surface) of the piezoelectric substrate 1. The back surface electrode 4 is comprised of, for example, an Al—Cu alloy or other Al alloy. The back surface electrode 4 is formed by sputtering, vapor deposition, CVD, or another thin film forming method. The back surface electrode 4 is formed on the entire back surface of the piezoelectric substrate 1. Accordingly, it becomes possible to ground electric charges charged at the front surface of the piezoelectric substrate 1 due to temperature changes, so problems such as breakage of the piezoelectric substrate 1 due to sparking and sparks between electrodes can be prevented.

Figure 2B:
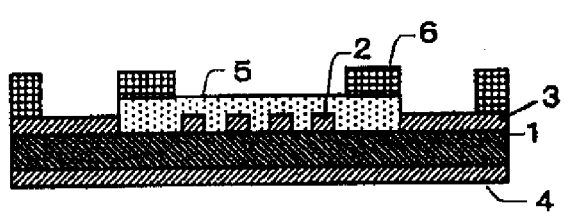

Next, as shown in FIG. 2B, in order to prevent oxidation etc. of the IDT electrode 2 etc., the IDT electrode 2 and the connecting lines 3 are covered by a protective film 5 comprised of silicon oxide, silicon nitride, silicone, or the like. The protective film 5 is formed by CVD or vapor deposition or another thin film formation method. Further, in order to connect them with external circuits, photolithography is used to remove portions of the protective film 5 so that at least portions of the connecting lines 3 are exposed.

(Step b)

Figure 2C:
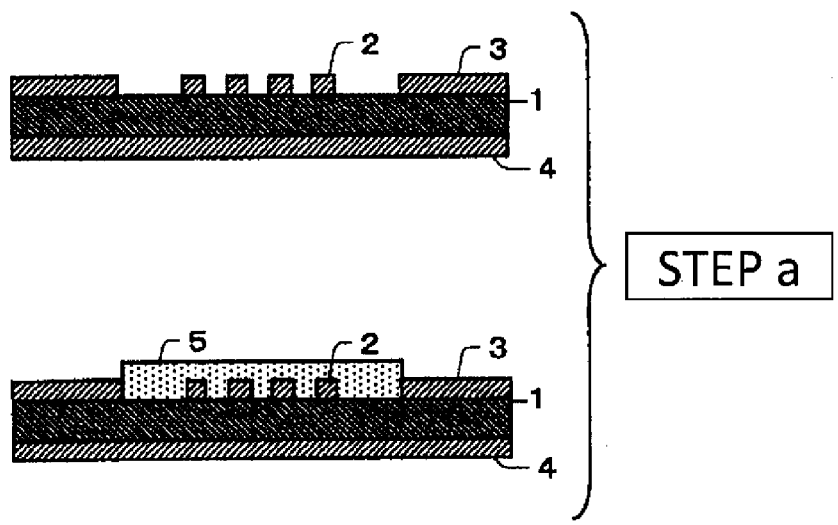

Next, as shown in FIG. 2C, a frame member 6 surrounding the IDT electrode 2 is formed by a first resist made of a predetermined photocurable material. As the first resist, use can be made of, for example, an epoxy-based resin, polyimide resin, BCB (benzocyclobutene), or acryl resin. Among those, preferably use is made of a resin which is cured by radical polymerization of acryl groups, methacryl groups, etc., more specifically, a urethane acrylate-based, polyester acrylate-based, or epoxy acrylate-based resin. A resin which is cured by radical polymerization, in a state after photocuring, has almost no acid or base inflicting damage to the IDT electrode 2 and connecting lines 3 in it. For this reason, a surface acoustic wave device in which damage to the IDT electrode 2 and the connecting lines 3 is reduced and which is excellent in electrical characteristics can be produced. The first resist is formed above the surface acoustic wave element region of the piezoelectric substrate 1 by for example spin coating, printing, or the like. Next, after an exposure step and a development step, the first resist is formed into a frame member 6 surrounding the region in which the IDT electrode 2 is formed.

Note that, the method of formation of the frame member 6 is not limited to this. For example, a film-shaped first resist which is formed into a frame shape in advance may be placed on the first main surface of the piezoelectric substrate 1 as well. In this case, a frame member 6 with a uniform thickness can be formed by just placing the film.

Figure 2D:
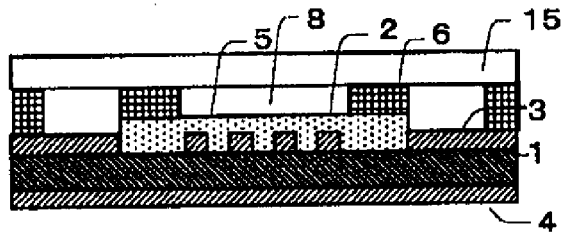

Next, as shown in FIG. 2D, a film-shaped second resist 15 is placed on the top surface of the frame member 6 to form a accommodating space 8. As the second resist 15, preferably use is made of the same material as the first resist. For example, use can be made of an epoxy-based resin, polyimide, BCB (benzocyclobutene), acrylic resin, etc. Among those, for the reasons the same as for the first resist, preferably use is made of a resin which is cured by radical polymerization of acryl groups, methacryl groups, etc., more specifically a urethane acrylate-based, polyester acrylate-based, or epoxy acrylate-based resin. This second resist 15 is a film shape. By just placing the second resist 15 on the top surface of the frame 6, the space 8 can be formed between this and the piezoelectric substrate 1. In order to place the second resist 15, the resist may be adhered to the top surface of the frame 6 by using a bonding machine.

Note that, in a case where a film-like member given a frame shape is used as the first resist, if the first resist and the second resist 15 are comprised of the same material, the two can be integrally combined when heating the frame member 6 and the lid member 7 to join them. The joint interface almost completely disappears, therefore the adhesion strength and air-tightness can be improved, and a highly reliable surface acoustic wave device can be produced. In particular, when using an epoxy-based resin as the material of the first and second resists and heating within a range of 100° C. to 200° C., polymerization is promoted more, therefore the adhesion strength and air-tightness can be improved.

Figure 2E:
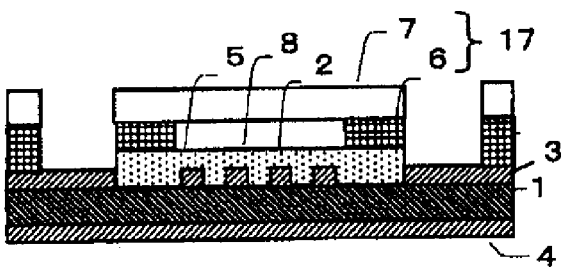

Next, as shown in FIG. 2E, after an exposure step and development step from the state of FIG. 2D, the second resist 15 is formed into the lid member 7 covering the surface acoustic wave element region. After that, the frame member 6 and the lid member 7 are joined by heating to form the protective cover 17. The heating temperature for joining them may be set to about 100° C. in a case where, for example, an epoxy resin is used as the frame 6 and an epoxy-based resin is used as the lid member 7. By this protective cover 17, the vibration space can be secured, and the IDT electrode 2 can be sealed, therefore oxidation etc. of the IDT electrode 2 can be prevented.

By producing the surface acoustic wave device by such a step a and step b, it is not necessary to form a sacrificial layer on the IDT electrode. Therefore, no etchant or residual products of etching remains in the internal portion (vibration space) of the hollow structure any longer when removing the sacrificial layer, so deterioration of the electric characteristics of the surface acoustic wave device can be prevented. As a result, the reliability of the surface acoustic wave device can be improved. Further, since the vibration space can be formed without using the sacrificial layer, the steps which were necessary for formation and removal of the sacrificial layer become unnecessary, so the number of steps for forming the vibration space can be decreased and the productivity can be raised.

(Step c)

FIGS. 3A to 3H are cross-sectional views of the different steps of the steps after FIG. 2E. Note that, FIG. 3A corresponds to the state of FIG. 2E.

Figure 3A:
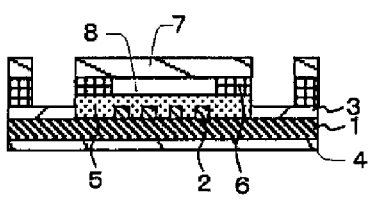
FIG. 3 A to I are cross-sectional views of different steps showing an embodiment of a method of production of a surface acoustic wave device according to the present invention.
Figure 3B:
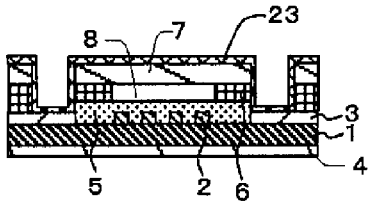

At step c, first, as shown in FIG. 3B, from the state shown in FIG. 2E, a plating use underlayer 23 is formed covering the surface acoustic wave element region over which the protective cover 17 is formed.

The plating use underlayer 23 is used for causing the columnar outside connection-use electrodes 10 to electrically precipitate or chemically precipitate. Further, the plating use underlayer 23 formed on the top surface of the protective cover 17 becomes a portion (first conductive layer 18a) of the conductive layer 18. Note that, generally Cu is utilized as the material of the plating use underlayer 23. However, if considering the close adhesion of the Cu and Al—Cu lines, preferably an adhesion layer of Cr or Ti is interposed. Note that, the thickness of plating is determined by the plating treatment time. When exceeding 30 μm, the electroplating treatment with its fast growth speed is preferred.

The plating use underlayer 23 is formed on the entire surface of the piezoelectric substrate 1 including the region for forming the columnar outside connection-use electrodes 10 by using for example Ti—Cu. The copper or other metal can be formed thick by an electroplating method via the plating use underlayer 23.

Particularly, in a case when forming the plating use underlayer 23 by flash plating, it is not necessary to form line patterns for making current flow only in the plating formation portion, therefore reduction of size of the chip becomes possible.

Figure 3C:
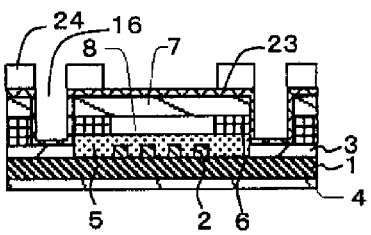

Next, as shown in FIG. 3C, on the plating use underlayer 23 above the connecting line 3 located on the outside the protective cover 17, a plating use resist 24 having openings 16 is formed. The plating use resist 24 is formed on the substrate by, for example, spin coating or another technique. Note that, by the viscosity of the used resist or number of times of coating by spin coating, it becomes possible to control the thickness of the resist from several micrometers to several hundreds of micrometers. Further, the openings 16 of the plating use resist 24 are preferably formed by a general photolithography process.

Further, at the step of FIG. 3C, the plating use resist 24 is preferably formed by repeating coating and curing of the resist material several times. By forming the plating use resist 24 in divided manner over several times in this way, a plating use resist 24 with a desired thickness can be formed by using a resist material appropriately adjusted considering the coated property and handling property, therefore the productivity can be raised. Further, the plating use resist 24 can be formed to the desired thickness. As a result, it becomes possible to form columnar outside connection-use electrodes 10 with a desired height.

Figure 3D:
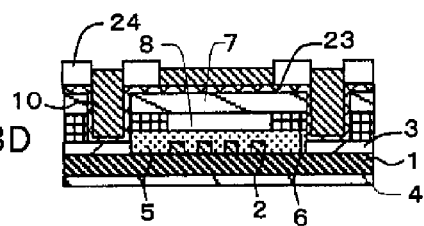

Next, as shown in FIG. 3D, on the plating use underlayer 23 exposed in the openings 16, the columnar outside connection-use electrodes 10 and conductive layer 18 are formed by plating. At this time, the predetermined outside connection-use electrodes 10 and the first and second conductive layers 18a and 18b which are formed on the top surface of the lid member 7 are continuously connected.

The columnar outside connection-use electrodes 10 can be formed by electroplating, electroless plating, stud bumps, etc. Among these, electroplating is preferred. This is the electroplating method enables the formation of the columnar outside connection-use electrodes 10 with a raised degree of freedom of height, and the adhesion with the plating use underlayer 23 is good. As the material of the outside connection-use electrodes 10, use can be made of solder, Cu, Au, Ni, or the like. In particular, when using Cu or solder, the process of formation becomes inexpensive, so this is preferred.

Figure 3E:
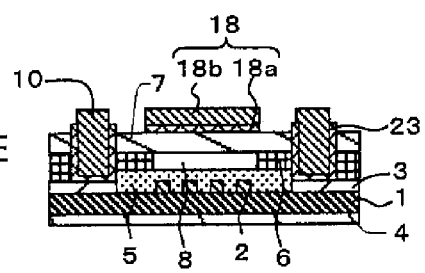

Next, as shown in FIG. 3E, the plating use resist 24 and predetermined portions of the plating use underlayer 23 are removed so that the columnar outside connection-use electrodes 10 and the conductive layer 18 remain. The plating use resist can be removed by acetone, IPA, or another organic solvent or dimethyl sulfoxide or another alkali organic solvent. Further, the Cu of the plating use underlayer 23 can be removed by a mixture of iron (II) chloride or phosphoric acid with a hydrogen peroxide solution. Further, the Ti of the plating use underlayer 23 can be removed by a mixture of a dilute fluoric acid or ammonia with a hydrogen peroxide solution. Among these, as one damaging the $SiO_2$ film and Al—Cu lines formed at the lower layer of the plating use underlayer 23 only a little, preferably use is made of a mixture of ammonia with the hydrogen peroxide solution for peeling off the Ti.

Figure 3F:
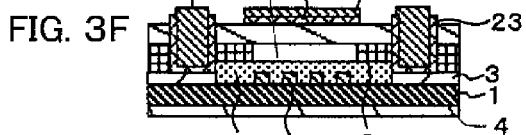

Next, as shown in FIG. 3F, the top surfaces of the second conductive layer 18b and the outside connection-use electrodes 10 are ground to make the heights of the outside connection-use electrodes 10 and the conductive layer 18 uniform. Specifically, the top surfaces of the second conductive layer 18b and the outside connection-use electrodes 10 are ground by a grinder using a grinding cutter. In order to connect outside connection terminals 13 comprised of conductor bumps or the like and the columnar outside connection-use electrodes 10 well, the surface may be finished by buffing etc.

Figure 3G:
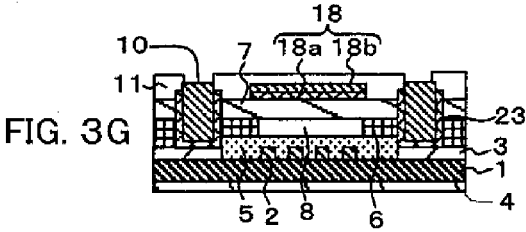

Next, as shown in FIG. 3G, the insulation layer 11 covering the protective cover 17, conductive layer 18, and the columnar outside connection-use electrodes 10 is formed.

As the material of the insulation layer 11, a polyimide resin and an epoxy-based resin are preferred. In particular, preferably use is made of one applying little stress to the piezoelectric substrate 1, for example, use is made of one having a linear expansion coefficient near that of the piezoelectric substrate 1 or use is made of one having a low modulus of elasticity. Further, if air bubbles were mixed into the insulation layer 11, this would become a cause of steam explosion, therefore printing by vacuum printing is preferred as well. Note that, the insulation layer 11 is preferably formed thick enough to cover the columnar outside connection-use electrodes 10.

Figure 3H:
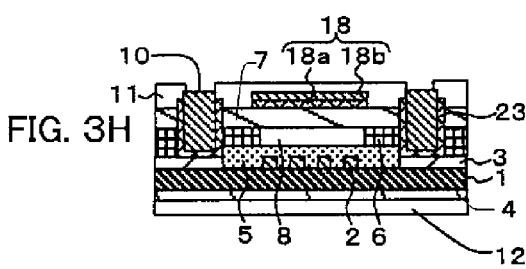

Next, as shown in FIG. 3H, on the second main surface (lower surface) of the piezoelectric substrate 1, a protective layer 12 comprised of a material having substantially the same linear expansion coefficient as that of the insulation layer 11 is formed.

By forming the protective layer 12, the structure becomes one where the lower surface portion of the piezoelectric substrate 1 on which the IDT electrode 2 is not formed is protected by the protective layer 12, and the shock resistance of the surface acoustic wave device at the time of production and after production can be improved. For this reason, cracks, chipping, or other defects of the surface acoustic wave device are reduced and the yield can be improved. Further, a structure where the bottom surface of the piezoelectric substrate 1 is protected by a protection member is employed, therefore entry of moisture from the interface between the piezoelectric substrate 1 and the sealing resin can be suppressed, and the air-tightness and moisture resistance of the surface acoustic wave device can be improved.

Further, a material having a thermal expansion coefficient substantially the same as that of the insulation layer 11 is used as the protective layer 12, therefore stress of the sealing resin in the production process can be eased, so almost no warping occurs in the piezoelectric substrate 1, and the reliability of the surface acoustic wave device can be improved.

Note that, the step shown in FIG. 3H may be appropriately added between the step a and the step c explained above. It may be provided after the step of FIG. 3E of forming the insulation layer 11 on the first main surface of the piezoelectric substrate 1. In this case, at the top surface and the bottom surface of the piezoelectric substrate 1, the stress applied to the piezoelectric substrate 1 due to the difference of the linear expansion coefficient between the piezoelectric substrate 1 and the insulation layer 11 can be cancelled out, so this is preferred.

Such a protective layer 12 is not limited in material so far as the linear expansion coefficient is substantially the same as that of the insulation layer 11. In particular, when using an epoxy-based resin, the thermal expansion coefficient can be controlled by adding a filler made of $SiO_2$ or the like, the moisture permeability is low, and the moisture absorption is high, therefore this is preferred.

Figure 3I:
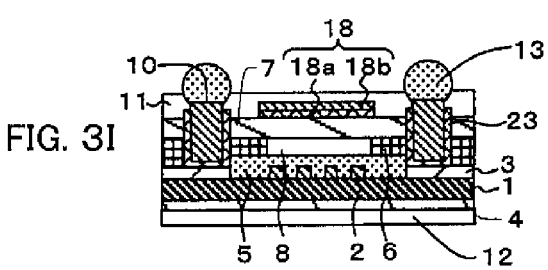
Figure 4:
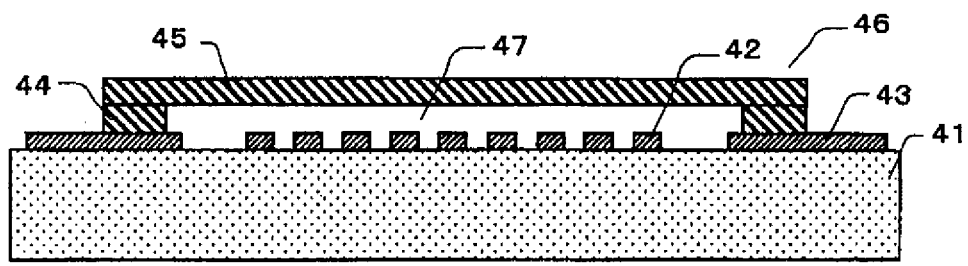
FIG. 4 A cross-sectional view showing an example of a conventional surface acoustic wave device.

Next, as shown in FIG. 3I, the outside connection terminals 13 are formed on the upper end faces of the columnar outside connection-use electrodes 10. The outside connection terminals 13 may be formed as conductor bumps by using a Pb—Sn alloy solder, lead-free solder, Au—Sn alloy solder, Au—Ge alloy solder, or another solder or thin films may be formed by a material having electric conductivity to form flat pads. For example, it is possible to screen print solder paste on the top portions of the substantially columnar outside connection-use electrodes 10 and re-flow it to form the outside connection terminals 13.

By going through such a step c, the outside connection terminals 13 are formed on the upper end faces of the columnar outside connection-use electrodes 10 exposed at the top surface of the insulation layer 11, whereby a surface mountable surface acoustic wave device can be obtained. Further, such a surface acoustic wave device can be formed at the wafer level, therefore the surface acoustic wave device can be obtained without going through a complex process. Further, the material of forming the outside connection terminals 13 can be selected in accordance with the mounting substrate for mounting the surface acoustic wave device, therefore the joining reliability with the mounting substrate can be improved.

Further, when applying the surface acoustic wave device of the present embodiment to a branching filter, the columnar outside connection-use electrodes 10 can be used as heat radiation electrodes as well. By arranging the columnar outside connection-use electrodes 10 in the vicinity of the heat generating portion of the IDT electrode 2, a branching filter excellent in heat radiation property can be obtained. Further, by adjusting the arrangement, number, and diameter of the columnar outside connection-use electrodes 10, the heat radiating property can be improved.

As described above, a surface acoustic wave device capable of suppressing the deformation of the hollow structure functioning as the vibration space of the acoustic wave can be produced.

Further, the surface acoustic wave device can be formed at the wafer level, therefore it becomes unnecessary to individually assemble surface acoustic wave devices formed as chips. For this reason, the small processing capability die bonder, seam welding machine, or other assembly device becomes unnecessary, greater simplification of the production process can be achieved, and the mass production ability can be raised.

Note that, the conductive layer 18 is not limited to one which is integrally formed by the same material as that for the outside connection-use electrodes 10 in the step the same as the step of forming the outside connection-use electrodes 10. For example, the conductive layer 18 need not be formed at FIG. 3B to FIG. 3F showing the step c of the embodiment. In place of that, between FIG. 3F and FIG. 3G, it is possible to place sheet metal on the outside connection-use electrodes 10 or form a film by a material different from that for the outside connection-use electrodes 10 to form the conductive layer 18.

Figure 8:
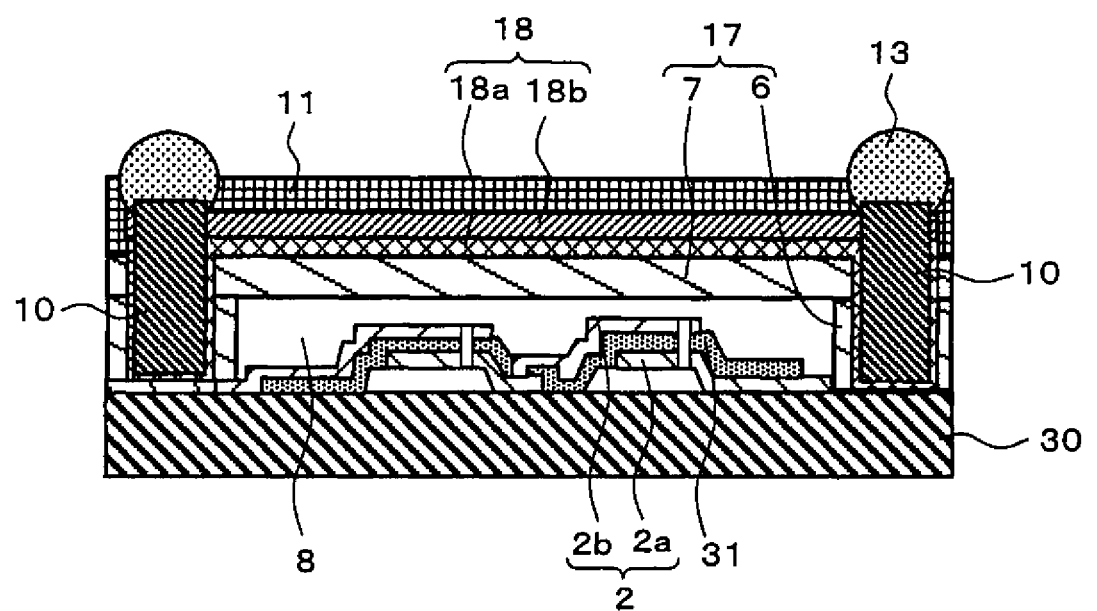
FIG. 8 A cross-sectional view showing an embodiment of a piezoelectric thin film resonator according to the present invention.

In the above embodiment, an explanation was given using a surface acoustic wave device as an example. However, the acoustic wave device of the present invention can also be applied to a piezoelectric thin film resonator sandwiching a thin piezoelectric film by excitation electrodes. FIG. 8 is a cross-sectional view of a piezoelectric thin film resonator showing an example of applying the acoustic wave device of the present invention to a piezoelectric thin film resonator.

The piezoelectric thin film resonator shown in the figure differs from the surface acoustic wave device explained above mainly in the structure of the portion generating resonance. In the piezoelectric thin film resonator shown in FIG. 8, the portion causing resonance is configured by including a lower electrode 2a formed on the main surface of a substrate 30 so as to provide a clearance between this and the substrate 30, a thin piezoelectric film 31 formed on the lower electrode 2a, and an upper electrode 2b formed on the thin piezoelectric film 31 so as to provide a portion facing the lower electrode 2a. In such a piezoelectric thin film resonator, the thin piezoelectric film 31 causes vibration in the vertical direction of thickness and that vibration causes resonance in the direction of thickness of the thin piezoelectric film 31.

In such a piezoelectric thin film resonator as well, the conductive layer 18 which is formed on the protective cover is formed continuously with the outside connection-use electrodes 10, therefore the conductive layer 18 is supported using the outside connection-use electrodes 10 as support columns, so deformation of the protective cover 17 forming the hollow structure can be suppressed. Accordingly, a piezoelectric thin film resonator which is substantially free of deterioration of electrical characteristics due to deformation of the accommodating space 8 and is excellent in long term reliability can be realized.

The invention claimed is:

1. An acoustic wave device, comprising:
a substrate configured to propagate an acoustic wave;
an excitation electrode on a first main surface of the substrate;
a protective cover comprising a hollow accommodating space in which the excitation electrode is accommodated on the first main surface;
at least two columnar outside connection-use electrodes electrically connected to the excitation electrode, wherein the outside connection-use electrodes penetrate the protective cover; and
a conductive layer connected to the outside connection-use electrodes on the protective cover,
wherein the hollow accommodating space is between two outside connection-use electrodes,
wherein the conductive layer covers the entire hollow accommodating space in a perspective plan view.

2. The acoustic wave device according to claim 1, wherein the outside connection-use electrodes are electrically connected to a reference potential terminal.

3. The acoustic wave device according to claim 1, wherein the excitation electrode and the outside connection-use electrodes are connected through a connecting line on the first main surface of the substrate.

4. The acoustic wave device according to claim 1, wherein the protective cover comprises a frame member surrounding the excitation electrode, and a lid member on the frame member.

5. The acoustic wave device according to claim 1, wherein the protective cover and the outside connection-use electrodes are covered by an insulation layer.

6. The acoustic wave device according to claim 5, wherein a side surface of the insulation layer and a side surface of the protective cover are covered by the conductive layer.

7. The acoustic wave device according to claim 1, wherein the conductive layer comprises Cu or Ni.

8. The acoustic wave device according to claim 1, wherein the conductive layer is comprised of the same material as that for the outside connection-use electrodes.

9. The acoustic wave device according to claim 1, wherein a Young's modulus of the conductive layer is larger than a Young's modulus of the protective cover.

10. The acoustic wave device according to claim 1, further comprising a columnar input-output signal use electrode which is electrically connected to the excitation electrode and is arranged with a space from the conductive layer.

11. The acoustic wave device according to claim 1, wherein the conductive layer is connected to the outer periphery of the outside connection-use electrodes.

12. The acoustic wave device according to claim 1, wherein the conductive layer is connected to the outside connection-use electrodes so as to cover an entire top surface of the outside connection-use electrodes.

13. An acoustic wave device comprising:
a substrate configured to propagate an acoustic wave;
an excitation electrode arranged on a first main surface of the substrate;
a protective cover comprising a hollow accommodating space in which the excitation electrode is accommodated on the first main surface;

at least two columnar outside connection-use electrodes electrically connected to the excitation electrode, wherein the outside-use connection electrodes penetrate the protective cover; and a conductive layer connected to the outside connection-use electrodes on the protective cover, wherein the hollow accommodating space is between two outside connection-use electrodes, wherein the conductive layer covers at least 50% of a top surface of the protective cover and covers at least a part of the hollow accommodating space in a perspective plan view.

14. An acoustic wave device comprising:

a substrate configured to propagate an acoustic wave;

an excitation electrode arranged on a first main surface of the substrate;

a columnar outside connection-use electrode electrically connected to the excitation electrode;

a protective cover comprising a hollow accommodating space in which the excitation electrode is accommodated on the first main surface;

a conductive layer connected to the outside connection-use electrode on the protective cover, and an insulation layer covering a top surface of the conductive layer, wherein the top surface of the conductive layer is roughened.

15. The acoustic wave device according to claim 14, wherein an arithmetic mean roughness of the top surface of the conductive layer is 1 to 3 μm.

* * * * *